United States Patent
Duggal et al.

(10) Patent No.: US 10,622,044 B2
(45) Date of Patent: Apr. 14, 2020

(54) MEMORY HOLD MARGIN CHARACTERIZATION AND CORRECTION CIRCUIT

(71) Applicant: QUALCOMM Incorporated, San Diego, CA (US)

(72) Inventors: Bipin Duggal, Irvine, CA (US); Naishad Parikh, Bangalore (IN); Ritu Chaba, San Diego, CA (US)

(73) Assignee: Qualcomm Incorporated, San Diego, CA (US)

(*) Notice: Subject to any disclaimer, the term of this patent is extended or adjusted under 35 U.S.C. 154(b) by 0 days.

(21) Appl. No.: 15/842,460

(22) Filed: Dec. 14, 2017

(65) Prior Publication Data

US 2019/0096460 A1    Mar. 28, 2019

(30) Foreign Application Priority Data

Sep. 22, 2017  (IN) .............................. 201741033679

(51) Int. Cl.
| | |
|---|---|
| *G11C 7/00* | (2006.01) |
| *G11C 8/18* | (2006.01) |
| *G11C 7/10* | (2006.01) |
| *H03H 11/26* | (2006.01) |
| *G11C 7/04* | (2006.01) |
| *G11C 7/22* | (2006.01) |
| *H03K 5/131* | (2014.01) |
| *H03K 5/13* | (2014.01) |

(52) U.S. Cl.
CPC ............... *G11C 8/18* (2013.01); *G11C 7/04* (2013.01); *G11C 7/1012* (2013.01); *G11C 7/222* (2013.01); *H03H 11/265* (2013.01); *H03K 5/13* (2013.01); *H03K 5/131* (2013.01)

(58) Field of Classification Search
CPC ...................................................... G11C 7/222
USPC ......................................................... 365/194
See application file for complete search history.

(56) References Cited

U.S. PATENT DOCUMENTS

| | | | |
|---|---|---|---|
| 5,796,673 A * | 8/1998 | Foss ..................... | G11C 7/1051 327/284 |
| 7,197,053 B1 | 3/2007 | Liu et al. | |
| 7,701,246 B1 | 4/2010 | Plants et al. | |
| 8,189,723 B2 * | 5/2012 | Berhanu ............... | H03L 7/0814 327/237 |
| 9,159,388 B2 | 10/2015 | Best et al. | |
| 9,494,649 B2 | 11/2016 | Iyer et al. | |
| 9,570,195 B2 | 2/2017 | Kashyap et al. | |
| 2009/0067277 A1 * | 3/2009 | Smith .................. | G11C 7/1066 365/230.06 |

(Continued)

*Primary Examiner* — Min Huang
(74) *Attorney, Agent, or Firm* — Arent Fox, LLP

(57) ABSTRACT

An apparatus including a memory subsystem. The memory subsystem includes a data input and a clock input. The apparatus also includes a variable delay circuit coupled to one of the data input or the clock input. Additionally, the apparatus includes a controller coupled to the variable delay circuit. The controller is configured to dynamically control the delay of the variable delay circuit. The controller may adjust the delay of the variable delay circuit based on at least one of timing data for a memory subsystem design of the memory subsystem, timing data for the memory subsystem, a voltage applied to the memory subsystem, or a temperature of the memory subsystem.

21 Claims, 6 Drawing Sheets

Data Path and Clock Skew Tuning

(56) References Cited

U.S. PATENT DOCUMENTS

| | | | |
|---|---|---|---|
| 2009/0244995 A1* | 10/2009 | Searles | G11C 7/1051 365/194 |
| 2009/0265514 A1* | 10/2009 | Biles | G06F 12/0804 711/154 |
| 2010/0157700 A1* | 6/2010 | Kong | G11C 7/1093 365/194 |
| 2011/0187427 A1* | 8/2011 | Kim | H03L 7/06 327/158 |
| 2011/0291720 A1* | 12/2011 | Ku | H03L 7/0814 327/158 |
| 2013/0223179 A1* | 8/2013 | Na | H03L 7/18 365/233.1 |
| 2014/0119141 A1* | 5/2014 | Tamlyn | G11C 29/022 365/193 |
| 2015/0228358 A1* | 8/2015 | Agata | G11C 29/023 714/718 |
| 2016/0013796 A1* | 1/2016 | Choi | H03L 7/0802 327/158 |

* cited by examiner

Data Path Tuning under different circumstances, the various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

MEMORY HOLD MARGIN CHARACTERIZATION AND CORRECTION CIRCUIT

CROSS-REFERENCE TO RELATED APPLICATION(S)

This application claims the benefit of Indian Patent Application Serial No. 201741033679, entitled "MEMORY HOLD MARGIN CHARACTERIZATION AND CORRECTION CIRCUIT" and filed on Sep. 22, 2017, which is expressly incorporated by reference herein in its entirety.

BACKGROUND

Field

The present disclosure relates generally to circuitry, and more particularly, to memory support circuitry.

Background

Hold margin is a term in electronics that defines the difference between an actual change in a signal and the latest time at which the signal can change in order for an electronic circuit to function correctly. As a memory device is being designed, a designer may estimate a hold margin requirement. Such a hold margin requirement for a memory device may be inaccurate, particularly early in the design of the memory. Accordingly, the hold margin for a particular design of a memory device may be "padded." In other words, the hold margin may be lengthened in time to allow for a functioning memory design, even when a hold time for a completed design is determined to be longer than was initially estimated. Padding of a hold margin may be used particularly in the initial phase of technology development. Accordingly, the hold margin used for a memory design may be larger than what may actually be needed for a functioning memory device of the design. Inaccurate hold margins may lead to over design for hold margins, which may lead to lower performance or potential device failures when the hold margins are not accurate.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

As discussed above, inaccurate hold margins may lead to over closure of design for hold. Over closure of design for hold may lead to lower performance or potential device failures when the hold margins are not accurate. Accordingly, the systems and methods described herein may allow for dynamic adjustment of one or more of clock skew, data path timing, or both. The adjustment of the one or more of clock skew, data path timing, or both may be based on conditions of the memory circuitry such as at least one of timing data for a memory cell design of the memory subsystem, timing data for the memory subsystem, a voltage applied to the memory, a temperature of the memory, a voltage of a memory subsystem, or a temperature of a memory subsystem.

In an aspect of the disclosure, a method, a computer-readable medium, and an apparatus are provided. The apparatus may be a memory. The apparatus includes a memory subsystem. The memory subsystem includes a data input and a clock input. The apparatus includes a variable delay circuit coupled to one of the data input or the clock input. The apparatus also includes a controller coupled to the variable delay circuit and configured to dynamically control the delay of the variable delay circuit.

In an aspect of the disclosure, the method includes determining a condition of a memory, determining a delay of the variable delay circuit of the memory based on the condition of the memory, and dynamically controlling the delay of the variable delay circuit of the memory based on the determined delay.

In an aspect of the disclosure, the apparatus includes means for determining a condition of a memory, means for determining a delay of the variable delay circuit of a memory based on the condition of the memory, means for dynamically controlling the delay of the variable delay circuit of the memory based on the determining of delay.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
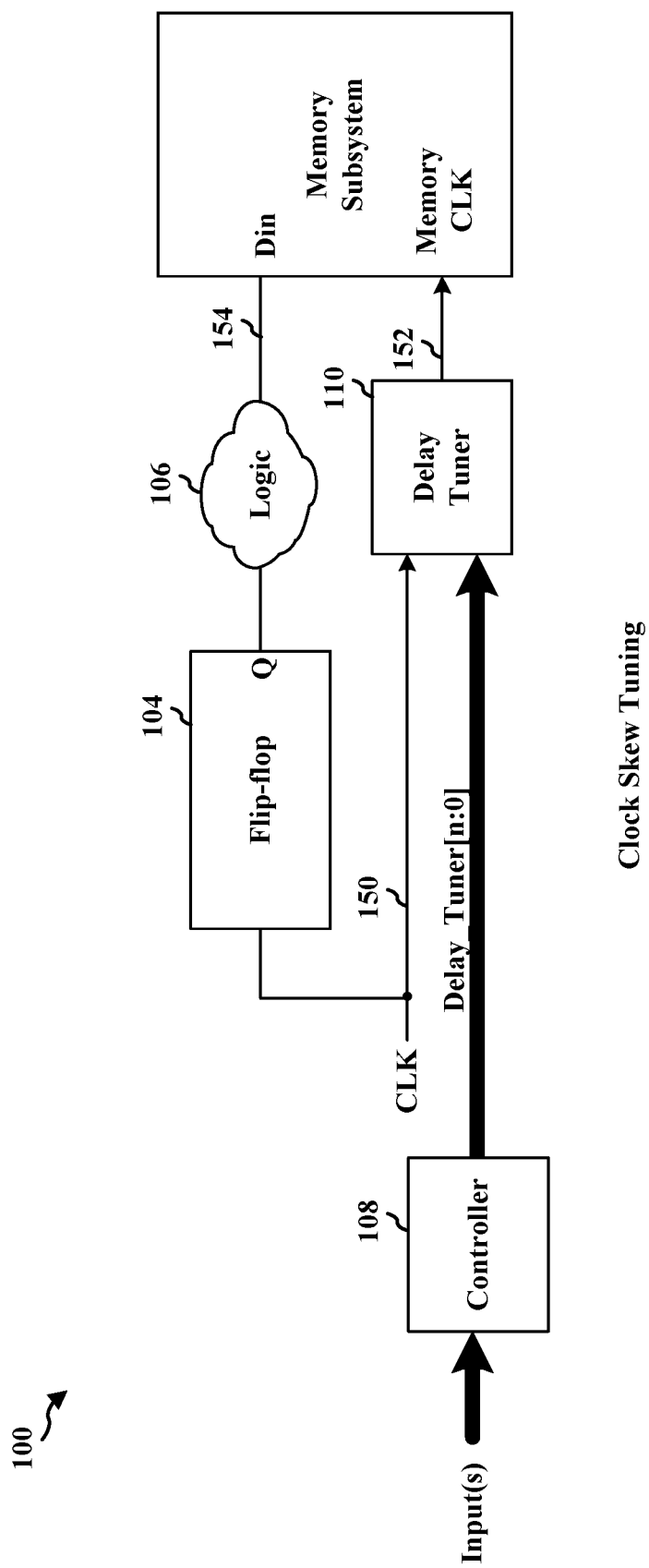
FIG. 1 is diagram illustrating an example circuit that may dynamically adjust clock delay using a delay tuner to allow the design to be modified to eliminate or decrease hold failures.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of memory systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is diagram illustrating an example circuit 100 that may adjust clock delay using a delay tuner 110 to allow the design to be dynamically modified to eliminate or decrease hold failures. For example, clock skew of a memory or data skew of the memory may be adjusted to reduce hold margin violations of a functioning chip. The circuit 100 includes a memory subsystem 102, a flip-flop 104, logic 106, and a controller 108. The circuit 100 includes signal lines for a clock (CLK) signal 150, a memory clock signal (Memory CLK) 152, and a data in (Din) signal 154. The data in (Din) signal 154 may be one or more logic signals. In an aspect, the memory subsystem 102 may be an array of memory cells forming a memory subsystem. The memory subsystem may include a plurality of memory cells, e.g., in an array of memory cells.

The memory subsystem 102 may be one or more of any type of writable memory, such as volatile memory including RAM, static RAM (SRAM), dynamic RAM (DRAM), or other types of memory. The memory may store a number of bits, bytes, words, or other data widths.

The flip-flop 104 may be one or more flip-flops and may form a register. Generally, the number of flip-flops, which may form a register, may be equal to the width of the array of the memory cell of the memory subsystem 102.

The logic 106 may be, for example, any logic circuitry that may be between the flip-flop 104 and the data input of the memory subsystem 102. For example, the logic 106 may include logic gates such as AND gates, OR gates, NAND gates, NOR gates, inverters, or other logic gates. The logic 106 may be any logic used to generate logical values that may be stored in the memory cell 102.

The controller 108 may control the delay imparted by the delay tuner 110. For example, the controller 108 may receive and input or inputs that may be used to calculate a delay based on, for example, at least one of timing data for a memory cell design of the memory subsystem, timing data for the memory subsystem, a voltage applied to the memory subsystem, or a temperature of the memory subsystem. Accordingly, the input(s) may be timing data for a memory cell design of the memory subsystem, timing data for the particular memory cell, a voltage applied to the memory cell, or a temperature of the memory cell or the array of memory cells. Timing data for a design may be based on simulation data for the design. Timing data for a particular memory cell may be based on measurements on a particular die, e.g., using hardware on a memory cell fabricated on a die. The voltage data and temperature data may also be measured on a particular die including the memory cell. Voltage and temperature may impact timing of signals in a memory, e.g., on a particular die. Accordingly, timing may be adjusted based on voltage and/or temperature. For example, delays across voltage and temperature may be calculated based on measurements taken on actual components and/or based on simulations, e.g., Simulation Program with Integrated Circuit Emphasis (SPICE) simulations.

The delay tuner 110 may receive an input from the controller 108 and may adjust a variable delay of the delay tuner based on the input from the controller 108. Accordingly, the delay of the clock signal (CLK) 150 may be changed, modified, or adjusted dynamically. In other words, the delay of the CLK 150 may be changed modified, or adjusted after the example circuit 100 is manufactured, not just in the design phase of the example circuit 100. Accordingly, as used herein, "changed, modified, or adjusted dynamically" indicates that a signal, e.g., clock or data, may be changed, modified, or adjusted after a circuit is manufactured, not just as part of the design of a circuit. For example, the controller 108 may adjust the delay tuner 110 back and forth between two settings of the delay tuner 110, while the device is in operation. The delay of the CLK 150 may be adjusted as needed after the example circuit 100 is manufactured. For example, the delay of the CLK 150 may be changed or adjusted based on conditions, such as timing aspects of a memory design (as implemented in a memory), temperature of the memory, voltage on the memory, e.g., conditions of a physical device. Accordingly, the example circuit 100 may adjust clock delay using the delay tuner 110 to allow the design to be modified to eliminate or decrease hold failures due to a failure of a design to meet required hold times. As illustrated in FIG. 1, the circuit 100 may be used to make adjustments to clock skew, e.g., to provide for hold required hold times in the circuit 100. Hold margin is an amount of time a signal needs to be stable after, e.g., a clock edge, to guarantee the signal is correctly clocked into a memory cell. The hold time may vary with changes in temperature, voltage, or other factors. A hold failure is an instance when a hold margin is violated. Clock skew is a delay in the clock signal. In an aspect, a circuit cannot be clocked until the signal is stable and the signal must remain stable for some period of time after, e.g., a clock edge. Skewing a clock signal may be used to compensate for hold failures. For example, a clock signal may be delayed so that a clock edge occurs after a signal has been stable for a long enough period of time. A delay of a clock edge may be decreased to allow a hold time after a clock edge to be met. The delay tuner 110 may receive an input from the controller 108 and may program a particular delay of a variable delay range based on the input from the controller 108. Accordingly, the delay of the data may be dynamically changed based on conditions, e.g., temperature, voltage, timing of a memory design or other factors that may impact timing of a memory design. The example circuit may adjust data path delay using delay tuner 110 to allow the design to be modified to eliminate or decrease hold failures due to failures to meet required hold times for memories. FIG. 1 is an example circuit diagram that illustrates a first option that may adjust clock delay using a delay tuner 110 to allow the design to be modified to eliminate or decrease hold failures.

Figure 2:
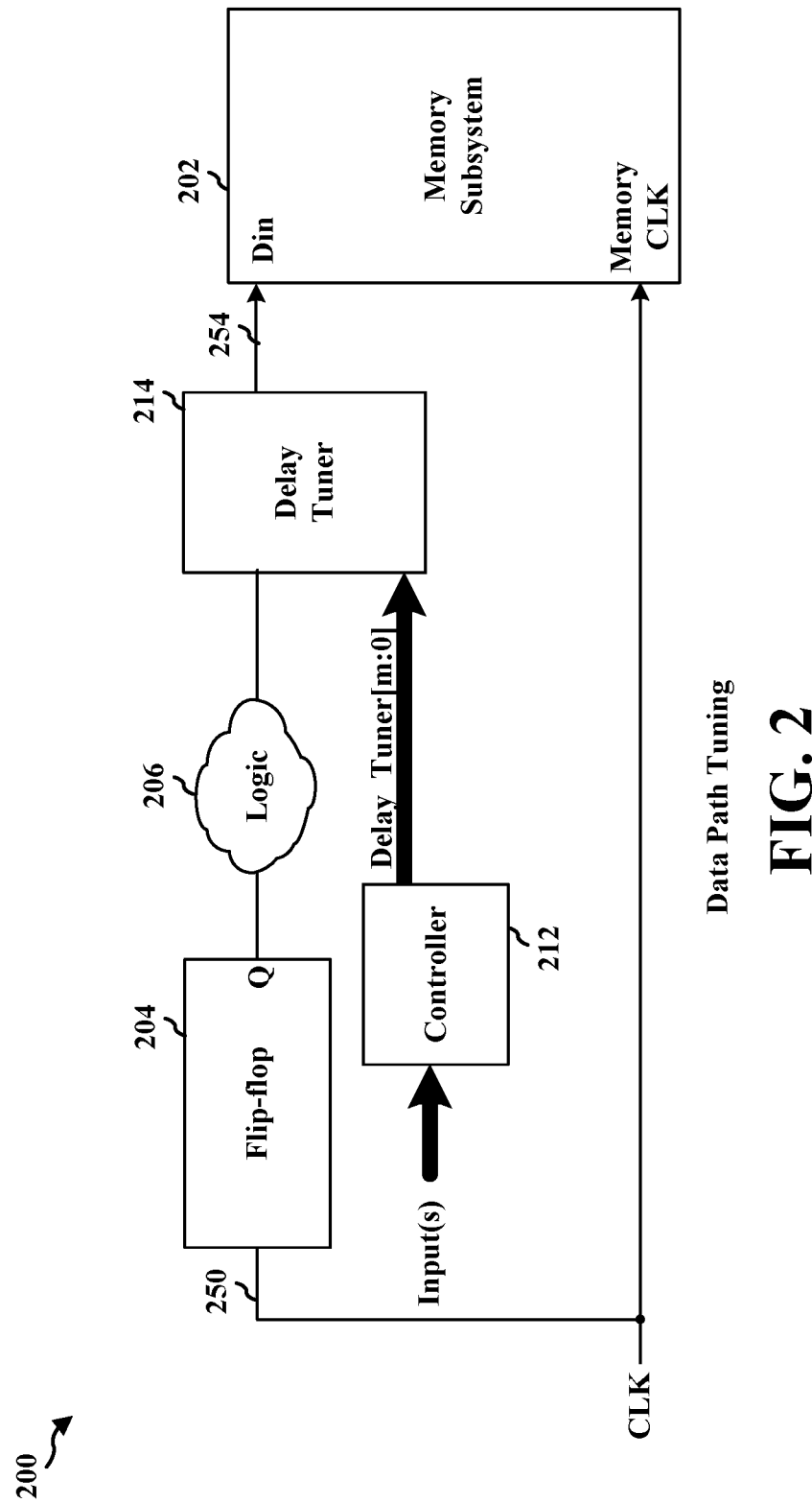
FIG. 2 is diagram illustrating an example circuit that may adjust data delay using a delay tuner to allow the design to be modified to eliminate or decrease hold failures.

FIG. 2 is diagram illustrating an example circuit 200 that may adjust data delay using a delay tuner 214 to allow the design to be modified to eliminate or decrease hold failures. The circuit 200 includes a memory subsystem 202, a flip-flop 204, logic 206, and a controller 212. The circuit 200 includes signal lines for a clock (CLK) signal 250 and data in (Din) 254. The data in (Din) signal 254 may be one or more logic signals. In the example circuit 200, the memory clock (Memory CLK) input of the memory subsystem 202 is driven by the clock (CLK) signal 250.

The memory subsystem 202 may be one or more of any type of writable memory. The flip-flop 204 may be one or more flip-flops and may form a register. Generally, the number of flip-flops, which may form a register, may be equal to the width of the array of the memory cells of the memory system 202. The circuit 200 may include an array of memory cells of the memory subsystem 202. The logic 206 may be, for example, any logic circuitry that may be between the flip-flop 204 and the data input of the memory subsystem 202. The logic circuitry 206 may be any logic used to generate an input or inputs to the memory subsystem 202.

The controller 212 may control the delay imparted by the delay tuner 214. For example, the controller 108 may receive an input or inputs that may be used to calculate a delay based on, for example, at least one of timing data for a memory cell design of the memory subsystem, timing data for the memory subsystem, a voltage applied to the memory subsystem, or a temperature of the memory subsystem. Accordingly, the input(s) may be timing data for a memory cell design of the memory subsystem, timing data for the particular memory cell, a voltage applied to the memory cell, or a temperature of the memory cell. Timing data for a design may be based on simulation data for the design. Timing data for a particular memory cell may be based on measurements on a particular die, e.g., using hardware on the die. The voltage data and temperature data may also be measured on a particular die including the memory.

The delay tuner 214 may receive an input from the controller 212 and may program a particular delay of a variable delay range based on the input from the controller 212. Accordingly, the delay of the data may be changed, modified, or adjusted dynamically. In other words, the delay of the data may be changed modified, or adjusted after the example circuit 200 is manufactured, not just in the design phase of the example circuit 200. The delay of the data may be adjusted as needed after the example circuit 200 is manufactured. The delay of the data may be based on conditions, e.g., temperature, voltage, timing of a memory design or other factors that may impact timing of a memory design. The example circuit may adjust data path delay using delay tuner 214 to allow the design to be modified to eliminate or decrease hold failures due to failures to meet required hold times for memories. FIG. 2 is an example circuit diagram that illustrates a second option that may adjust data delay using a delay tuner 214 to allow the design to be modified to eliminate or decrease hold failures.

Figure 3:
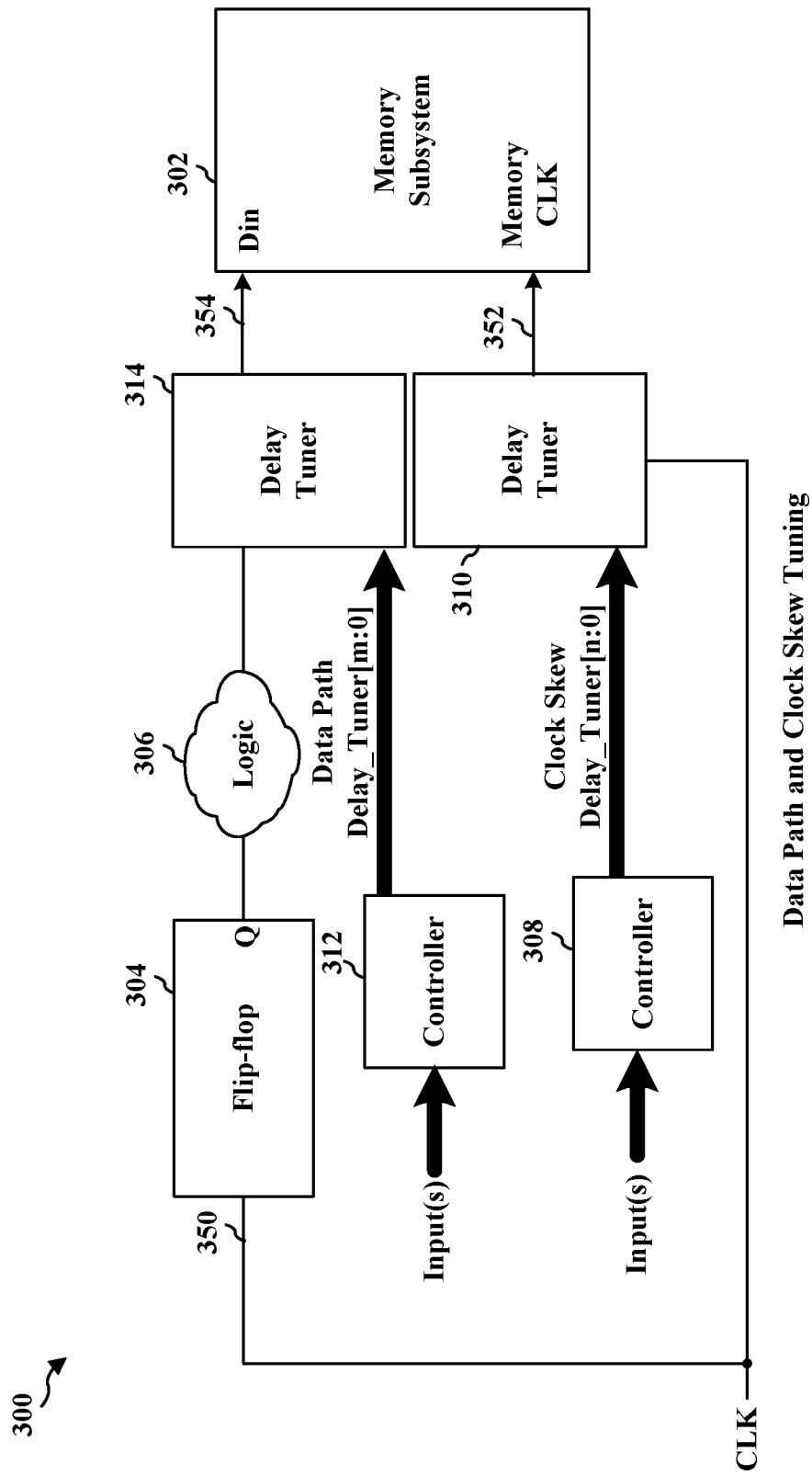
FIG. 3 is diagram illustrating an example circuit that may adjust clock delay using delay tuners to allow the design to be modified to eliminate or decrease hold failures.

FIG. 3 is diagram illustrating an example circuit 300 that may adjust clock delays (e.g., as in FIG. 1) and data delays (e.g., as in FIG. 2) using delay tuners 310, 314. The example circuit 300 may allow the design to be modified to eliminate or decrease hold failures due to a memory design not meeting a required hold time of the memory. Additionally, in some cases, the example circuit 300 may offer greater flexibility when compared to the example of FIG. 1 alone or the example of FIG. 2 alone. The circuit 300 includes a memory subsystem 302, a flip-flop 304, logic 306, and controllers 308, 312. The circuit 300 includes signal lines for a clock (CLK) signal 350, a memory clock signal (Memory CLK) 352, and data in (Din) 354. The data in (Din) signal 354 may be one or more logic signals.

The memory subsystem 302 may be one or more of any type of writable memory. For example, the memory subsystem 302 may include an array of memory cells. The flip-flop 304 may be one or more flip-flops and may form a register. Generally, the number of flip-flops, which may form a register, may be equal to the width of the array of the memory cells of the memory subsystem 302. The logic 306 may be, for example, any logic circuitry that may be between the flip-flop 304 and the data input of the memory subsystem 302.

FIG. 3 is an example circuit diagram that illustrates a third option that may adjust both clock delay and data delay using a pair of delay tuners to allow the design to be modified to eliminate or decrease hold failures. The circuit illustrated in FIG. 3 may be used to make adjustments to both Td and clock skew.

The controller 308 may control the delay imparted by the delay tuner 310. For example, the controller 308 may receive and input or inputs that may be used to calculate a delay based on, for example, at least one of timing data for a memory cell design of the memory subsystem, timing data for the memory subsystem, a voltage applied to the memory subsystem, or a temperature of the memory subsystem. Accordingly, the input(s) may be timing data for a memory cell design of the memory subsystem, timing data for the particular memory cell, a voltage applied to the memory cell, or a temperature of the memory cell. Timing data for a design may be based on simulation data for the design. Timing data for a particular memory cell may be based on measurements on a particular die, e.g., using hardware on the die. The voltage data and temperature data may also be measured on a particular die including the memory.

The delay tuner 310 may receive an input from the controller 308 and may cause a variable delay based on the input from the controller 308. Accordingly, the delay of the clock signal (CLK) 350 may be modified, or adjusted dynamically. In other words, the delay of the CLK 350 may be changed modified, or adjusted after the example circuit 300 is manufactured, not just in the design phase of the example circuit 300. The delay of the clock may be adjusted as needed after the example circuit 300 is manufactured. The delay of the clock signal (CLK) 350 may be changed based on conditions, e.g., voltage, temperatures, design timing, or other factors that impact timing. Accordingly, the example circuit 300 that may adjust clock delay using a delay tuner 310 to allow the design to be modified to eliminate or decrease hold failures due to a memory design not meeting a required hold time for the memory. As illustrated in FIG. 3, the circuit 300 may be used to make adjustments to clock skew.

The controller 312 may also control the delay imparted by the delay tuner 314 to adjust timing of a data signal path. For example, the controller 308 may receive and input or inputs that may be used to calculate a delay based on, for example, at least one of timing data for a memory cell design of the memory subsystem, timing data for the memory subsystem, a voltage applied to the memory subsystem, or a temperature of the memory subsystem. Accordingly, the input(s) may be timing data for a memory cell design of the memory cell, timing data for the particular memory cell, a voltage applied to the memory cell, or a temperature of the memory cell. Timing data for a design may be based on simulation data for the design. Timing data for a particular memory cell may be based on measurements on a particular die, e.g., using hardware on the die. The voltage data and temperature data may also be measured on a particular die including the memory.

The delay tuner 314 may receive an input from the controller 312 and may cause a variable delay based on the input from the controller 312. Accordingly, the delay of the data may be changed, modified, or adjusted dynamically. In other words, the delay of the data may be changed modified, or adjusted after the example circuit 300 is manufactured, not just in the design phase of the example circuit 300. The delay of the data may be adjusted as needed after the example circuit 300 is manufactured. The delay of the data may be based on conditions, e.g., temperature, voltage, or other conditions. The example circuit that may adjust data path delay using a delay tuner 314 to allow the design to be modified to eliminate or decrease hold failures due to a design not meeting a required hold time. FIG. 3 is an example circuit diagram that illustrates a third option that may adjust data delay using a delay tuner 314 or adjust clock delays using delay tuner 310 to allow the design to be modified to eliminate or decrease hold failures. In an aspect, the controller 308 and the controller 312 may be implemented using a single processor, logic device, or circuitry to implement the systems and methods described herein.

An aspect may be implemented as a memory (e.g., circuit 100, 200, 300). The memory (e.g., circuit 100, 200, 300) may include a memory cell (e.g., of the memory subsystems 102, 202, 302). The memory cell (e.g., of the memory subsystems 102, 202, 302) may include a data input (Din) and a clock input (Memory CLK). The memory (e.g., circuit 100, 200, 300) may also include a variable delay circuit (delay tuner 110, 214, 310, 314). The variable delay circuit (delay tuner 110, 214, 310, 314) may be coupled to one of the data input (Din) or the clock input (Memory CLK). The memory (e.g., circuit 100, 200, 300) may also include a controller (108, 212, 308, 312). The controller (108, 212, 308, 312) may be coupled to the variable delay circuit (delay tuner 110, 214, 310, 314). Additionally, the controller (108, 212, 308, 312) may be configured to dynamically control the delay of the variable delay circuit (delay tuner 110, 214, 310, 314), e.g., to adjust clock or data timing to meet a minimum hold time and/or hold margin.

In an aspect, the variable delay circuit is coupled to the data input of the memory subsystem.

In an aspect, the variable delay circuit is coupled to the clock input of the memory subsystem. An aspect may further include a second variable delay circuit coupled to the data input.

In an aspect, the controller (108, 212, 308, 312) may adjust the delay of the variable delay circuit (delay tuner 110, 214, 310, 314) based on at least one of timing data for a memory cell design of the memory subsystem, timing data for the memory subsystem, a voltage applied to the memory subsystem, or a temperature of the memory subsystem.

In an aspect, the variable delay circuit includes a multiplexer and an array of buffers, an output of each buffer of the array of buffers coupled to a corresponding input of the multiplexer, the buffers coupled together in a daisy chain configuration with a first buffer input coupled to the clock.

In an aspect, the controller (108, 212, 308, 312) outputs select bits to the multiplexer to adjust the delay of the variable delay circuit.

In an aspect, an output of the multiplexer is coupled to the data input of the memory subsystem (Din).

In an aspect, an output of the multiplexer is coupled to the clock input of the memory subsystem (Memory CLK).

An aspect may further include a second variable delay circuit (delay tuner 314) coupled to the data input. In some examples, the variable delay circuit (delay tuner 310) and the second variable delay circuit (delay tuner 314) may include the same or similar circuitry. For example, the second variable delay circuit (314) may include a second multiplexer and an second array of buffers, an output of each buffer of the second array of buffers coupled to a corresponding input of the second multiplexer, the buffers of the second array of buffers coupled together in a daisy chain configuration with a first buffer input of the second array of buffers coupled to the clock. Delays for the variable delay circuit (delay tuner 310) and the second variable delay circuit (delay tuner 314) may be calculated to eliminate or decrease hold failures due to a memory design not meeting a required hold time of the memory. For example, the clock signal and/or the data signal may be delayed such that the data signal is held constant for a required time prior to an edge of the clock signal.

Figure 4:
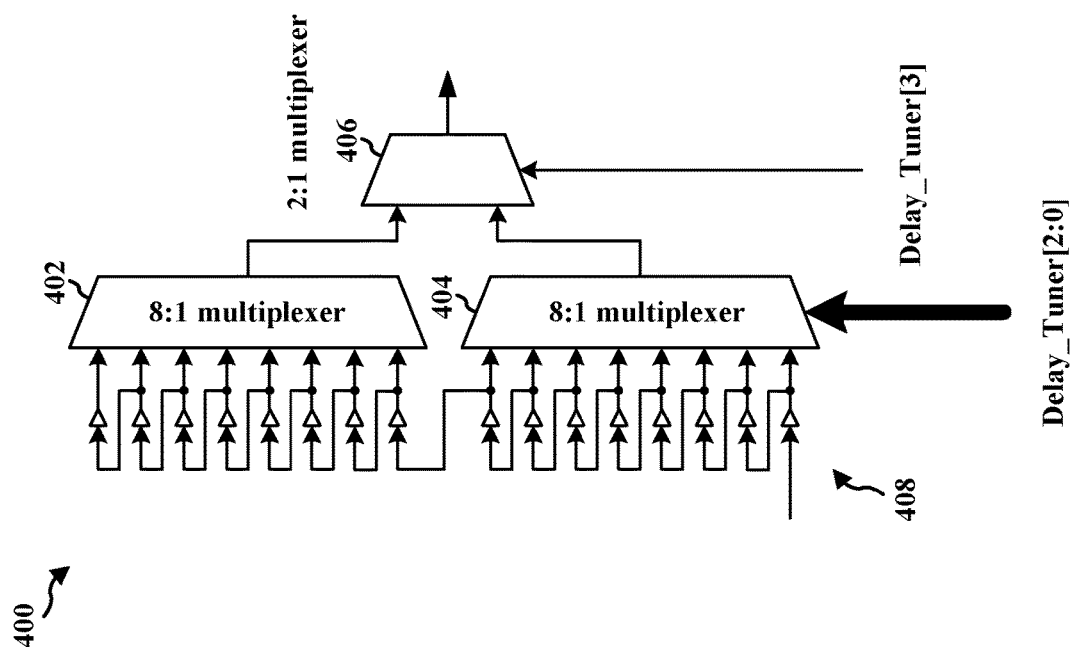
FIG. 4 is a circuit diagram illustrating an example delay tuner that may be used in the circuits of FIGS. 1-3.

FIG. 4 is a circuit diagram illustrating an example delay tuner 400 that may be used in the circuits 100, 200, 300 of FIGS. 1-3 (e.g., the delay tuner 110, 214, 310, 314). The delay tuners 110, 214, 310, 314 may be $2^n$ or $2^m$ bits wide. The example delay tuner 400 of FIG. 4 has n (or m) set equal to 4 and, accordingly, is $2^4$ bits wide, i.e., 16 bits wide.

The example delay tuner 400 is 16 bits wide and, in the illustrated example, formed using two 8:1 multiplexers 402, 404 and a 2:1 multiplexer 406. The delay may be controlled by data path delay tuner[3:0]. The two 8:1 multiplexers 402, 404 may be controlled by data path delay tuner[2:0]. The 2:1 multiplexer 406 may be controlled by data path delay tuner[3]. Controller 108 may be coupled to the delay tuner 110 via the signal lines (Delay_Tuner[n:0],) to signal the delay to be used for clock path delay. Controller 212 may be coupled to the delay tuner 214 via the signal lines (Delay_Tuner[m:0]) to signal the delay to be used for data path delay. Controller 308, 312 may be coupled to the delay tuner 310, 314 via the signal lines (Clock Skew Delay_Tuner[n:0], Data Path Delay_Tuner[m:0],) to signal the delay to be used for the clock path delay or the data path delay.

In the delay tuner 400 a signal enters a series of buffers 408. The buffers may control a delay from one to sixteen, plus a delay through 2:1 multiplexer 406. For example, for a delay tuner value (Delay_Tuner[3:0]) of 0000 bits, the delayed clock signal may be delayed one time through the 8:1 multiplexer 404 and once through 2:1 multiplexer 406. The delay time may be a period of time through a multiplexer and may be measured in seconds, e.g., fractions of seconds. For a delay tuner value (Delay_Tuner[3:0]) of 0001 bits, the delayed clock signal may be delayed two times through the 8:1 multiplexer 404 and once through 2:1 multiplexer 406. For a delay tuner value (Delay_Tuner[3:0]) of 0010 bits, the delayed clock signal may be delayed three times through the 8:1 multiplexer 404 and once through 2:1 multiplexer 406. For a delay tuner value (Delay_Tuner[3:0]) of 1111 bits, the delayed clock signal may be delayed sixteen times through the 8:1 multiplexer 404, the 8:1 multiplexer 402, and once through 2:1 multiplexer 406. For other examples, refer to TABLE 1.

TABLE 1 summarizes the delays for each value of Delay_Tuner[3:0]. The values used in TABLE 1 are calculated that one unit of delay is added for each pass through the multiplexers 402, 404, 406. In an aspect, changes in timing due to conditions of a memory may impact timing through the multiplexers. Accordingly, some examples may consider the changes in timing through the multiplexers when determining delay values to be used.

TABLE 1

| Dealy_Tuner[3:0] | Delay (through both muxes) |
|---|---|
| 0000 | 1 + 1 = 2 |
| 0001 | 2 + 1 = 3 |
| 0010 | 3 + 1 = 4 |
| 0011 | 4 + 1 = 5 |
| 0100 | 5 + 1 = 6 |
| 0101 | 6 + 1 = 7 |
| 0110 | 7 + 1 = 8 |
| 0111 | 8 + 1 = 9 |
| 1000 | 9 + 1 = 10 |
| 1001 | 10 + 1 = 11 |
| 1010 | 11 + 1 = 12 |
| 1011 | 12 + 1 = 13 |
| 1100 | 13 + 1 = 14 |
| 1101 | 14 + 1 = 15 |
| 1110 | 15 + 1 = 16 |
| 1111 | 16 + 1 = 17 |

Figure 5:
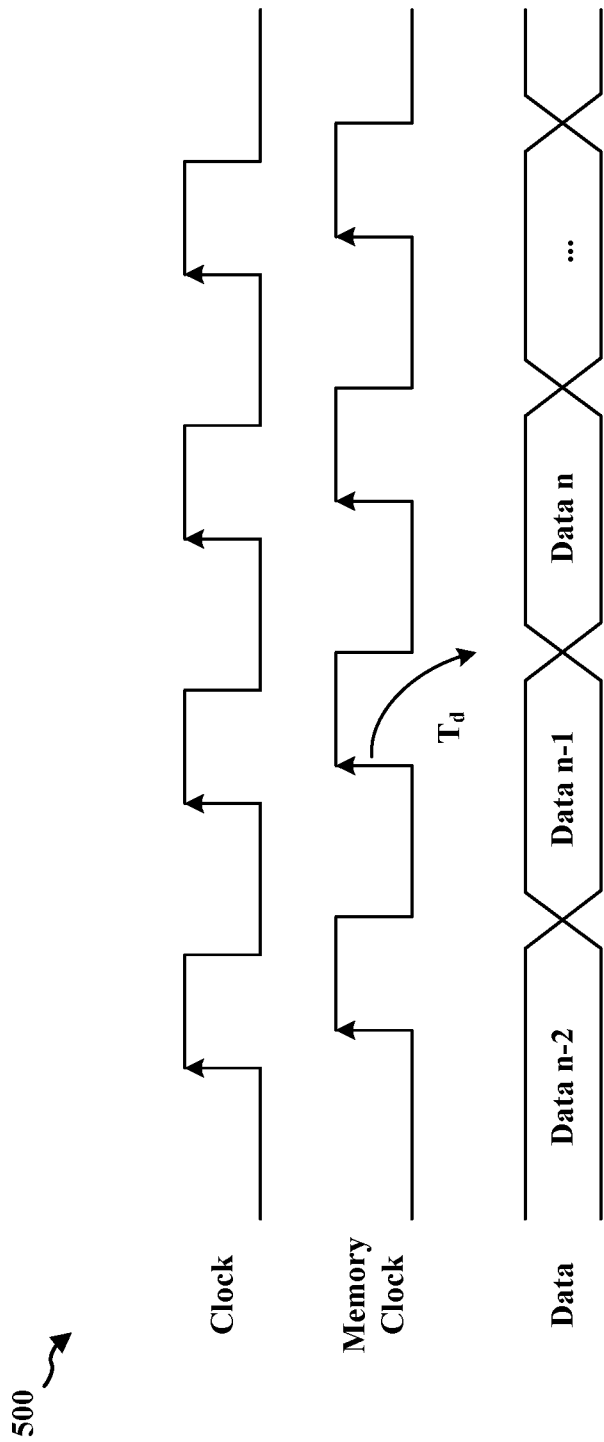
FIG. 5 is a timing diagram illustrating signals on a clock signal line, a memory clock signal line, and data lines.

FIG. 5 is a timing diagram 500 illustrating various memory signals. The signals include a clock signal (150, 250, 350), a memory clock signal (152, 352), and data signals (154, 254, 354). A memory circuit (100, 200, 300) that meets a hold requirement may be referred to as a "hold clean circuit." The example circuits (100, 200, 300) of FIGS. 1-3 may be used to adjust timing of a data path (104, 106, 154; 204, 206, 214, 254; 304, 306, 314, 354), a clocking path (150, 110, 152; 250; 350, 310, 352) to ensure a memory circuit (e.g., memory subsystem 102, 202, 302) of a particular design is a hold clean circuit. A hold clean circuit may satisfy equation (1):

$$T_d > T_{clk\_skew} + \text{Hold Margin} + \text{AOCV} + T_{hold} \quad (1)$$

The time the data line is stable may be greater than the clock skew plus the hold margin plus the Advanced On Chip Variation (AOCV) and the hold time. The AOCV may be used to mitigate any unknowns and/or uncertainties which are not modeled. The AOCV may also be used to account for any "silicon to model gap." Silicon to model gap are variations between actual silicon components and those parts as modeled by simulations. Each of these may be measured in seconds or some other unit of time. For a circuit to meet equation (1), adjustments may be made to one or more of $T_d$, e.g., using delay on the data paths (214, 314) of FIGS. 2 and 3 or $T_{clk\_skew}$, clock skew, e.g., using delay on the clock path (110, 310) of FIGS. 1 and 3. As discussed above, the circuit illustrated in FIG. 1 may be used to make adjustments to clock skew. The circuit illustrated in FIG. 2 may be used to make adjustments to $T_d$. The circuit illustrated in FIG. 3 may be used to make adjustments to both $T_d$ and clock skew.

Figure 6:
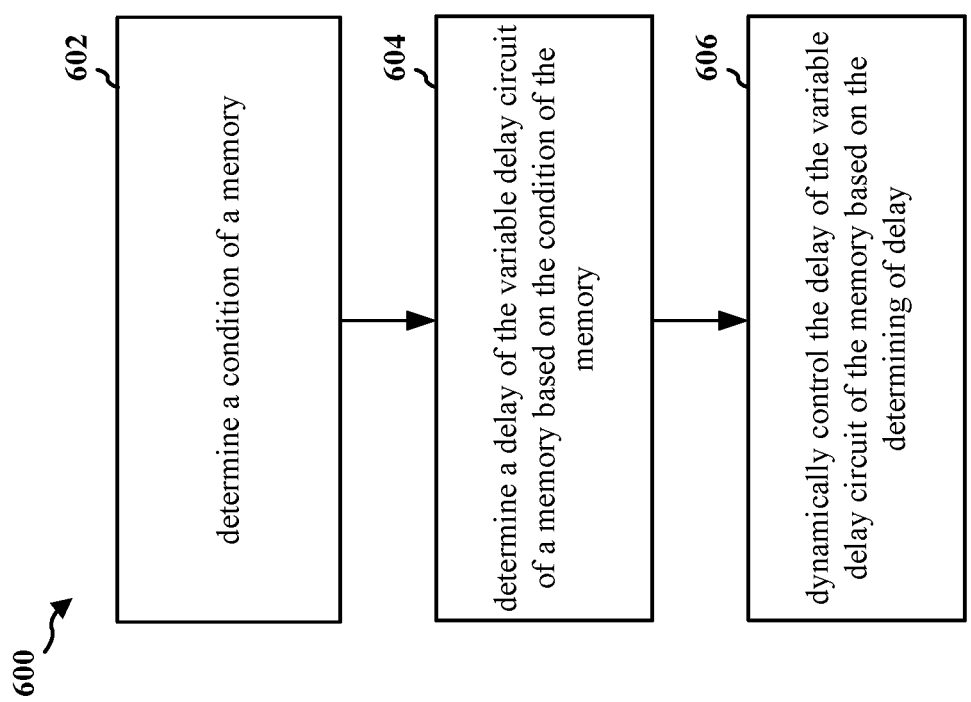
FIG. 6 is a flowchart of a method in a memory.

FIG. 6 is a flowchart 600 of a method of wireless communication. The method may be performed by various circuitry (e.g., the example circuits 100, 200, 300, 400). At 602, the circuitry determines a condition of a memory. For example, the circuitry (e.g., circuit 100, 200, 300) determines a condition of a memory. In an aspect, conditions of the memory such as timing data for a memory cell design of the memory subsystem, timing data for the memory subsystem, a voltage applied to the memory subsystem, or a temperature of the memory subsystem determined and/or measured and provided to the controller 108, 212, 308, 312. For example, the circuitry may determine a voltage using a voltage measurement device. For example, the die may include voltage measurement circuitry. The circuitry may determine a temperature using a temperature measurement device. The temperature measurement device may be on a die including the circuitry or may be adjacent to such a die or coupled to such a die. For example, the die may have a temperature probe attached to the die. Accordingly, a device implementing the method may measure a condition of the memory and report the result of the measurement of the condition of the memory.

In an aspect, timing data may be timing data for a memory cell design of a memory. The timing data may be, e.g., from simulated or modeled design information for the memory cell design. The timing data may be provided to the controller 108, 212, 308, 312.

In an aspect, timing data for the memory cell, e.g., the specific memory cell, may be based on testing of a particular implementation, e.g., a particular die, for a memory design. For example, circuitry on the die may measuring timing of signals on the particular die.

In an aspect, voltage, e.g., a voltage at one or more locations within a memory design, e.g., one or more locations on a die implementing the memory design, may be measured, e.g., by circuitry on the die. The voltage applied to the memory cell, e.g., at one or more locations, may be provided to the controller 108, 212, 308, 312. Voltage may be one condition of the memory.

In an aspect, a temperature of the memory cell, e.g., a temperature at one or more locations in a memory design, e.g., one or more locations on a die implementing the memory design may be measured, e.g., by circuitry on the die. The temperature data, e.g., at one or more locations on the die, may be provided to the controller 108, 212, 308, 312. Temperature may be one condition of the memory.

At 604, the circuitry determines a delay of the variable delay circuit of a memory based on the condition or conditions of the memory. For example, the circuitry 100, 200, 300 determines a delay of the variable delay circuit of a memory based on the condition of the memory. The controller 108, 212, 308, 312 may determine a delay of the variable delay circuit of a memory based on the condition of the memory. The delay may be determined by simulating or calculating delays needed such that the clock signal and/or the data signal may be delayed such that the data signal is held constant for a required time prior to an edge of the clock signal. Accordingly, a device implementing the method may determine a difference between a clock signal and a data signal, e.g., determine a hold time. The device implementing the method may then determine a modification for one or more of a clock delay or a data delay that may result in an adequate hold time.

At 606, the circuitry dynamically controls a delay of the variable delay circuit of a memory based on the determination. For example, the circuitry 100, 200, 300 may dynamically control the delay of the variable delay circuit of the memory based on the determining of delay. For example, the controller 108, 212, 308, 312 may control the delay tuner 110, 214, 310, 314 to dynamically control the delay added by the delay tuner 110, 214, 310, 314. For example, the device implementing the method may read the determined modification for the one or more of the clock delay or the data delay and adjust one or more of a clock delay or a data delay to provide an adequate hold time. The calculations and/or adjustments may be periodic in some examples. The calculations and/or adjustments may be made based on changes of conditions of the device in some examples.

In an aspect of dynamically controlling delay, the systems and methods described herein may dynamically controlling the delay of the variable delay circuit of the memory includes dynamically controlling a variable delay to a data input of the memory subsystem (FIGS. 2 and 3).

In an aspect of dynamically controlling delay, the systems and methods described herein may dynamically controlling the delay of the variable delay circuit of the memory includes dynamically controlling a variable delay to the clock input of the memory subsystem (FIGS. 1 and 3). In an aspect, dynamically controlling the delay of the variable delay circuit of the memory includes both dynamically controlling a variable delay to the clock input of the memory subsystem and dynamically controlling a variable delay to the data input (FIG. 3).

In an aspect, dynamically controlling the delay of the variable delay circuit includes adjusting delay based on at least one of timing data for a memory cell design of the memory subsystem, timing data for the memory subsystem, a voltage applied to the memory subsystem, or a temperature of the memory subsystem.

The apparatus (e.g., memory) described herein includes various components including memory subsystem 102, 202, 302, flip-flops 104, 204, 304, logic 106, 206, 306, controllers 108, 212, 308, 312, and delay tuners 110, 214, 310, 314. The apparatus may include additional components that perform each of the blocks of the algorithm in the aforementioned flowchart of FIG. 6. As such, each block in the aforementioned flowchart of FIG. 6 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

An example apparatus may include means for determining a condition of a memory (e.g., measurement or determination components providing the input(s) to the controller 108, 212, 308, 312). The means for determining a condition of a memory may include temperature measurement component(s), voltage measurement component(s), data components, e.g., for receiving memory design data. An example apparatus may include means for determining a delay of the variable delay circuit of a memory based on the condition of the memory (e.g., controller 108, 212, 308, 312). An example apparatus may include means for means for dynamically controlling the delay of the variable delay circuit of the memory based on the determining of delay (e.g., controller 108, 212, 308, 312 and/or the delay tuner 110, 214, 310, 314).

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. An apparatus comprising:
    a memory subsystem including a data input and a clock input;
    a first variable delay circuit coupled to the clock input;
    a second variable delay circuit coupled to the data input; and
    a controller coupled to the first variable delay circuit and the second variable delay circuit and configured to dynamically control a first delay of the first variable delay circuit and a second delay of the second variable delay circuit;
    wherein the first variable delay circuit comprises:
        a first multiplexer, wherein an output of the first multiplexer is coupled to the clock input of the memory subsystem; and a first array of buffers, an output of each buffer of the first array of buffers coupled to a corresponding input of the first multiplexer, each buffer of the first array of buffers coupled together in a first daisy chain configuration, and a first buffer input of the first array of buffers coupled to a clock; and wherein the second variable delay circuit comprises:
a second multiplexer, wherein an output of the second multiplexer is coupled to the data input of the memory subsystem; and
a second array of buffers, an output of each buffer of the second array of buffers coupled to a corresponding input of the second multiplexer, each buffer of the second array of buffers coupled together in a second daisy chain configuration, and a second buffer input of the second array of buffers coupled to a data path.

2. The apparatus of claim 1, wherein the controller is further configured to adjust the first delay of the first variable delay circuit and the second delay of the second variable delay circuit based on at least one of timing data for a memory subsystem design of the memory subsystem, timing data for the memory subsystem, a voltage applied to the memory subsystem, or a temperature of the memory subsystem.

3. The apparatus of claim 1, wherein the controller outputs select bits to the first multiplexer to adjust the first delay of the first variable delay circuit.

4. The apparatus of claim 1, wherein the controller outputs select bits to the second multiplexer to adjust the second delay of the second variable delay circuit.

5. The apparatus of claim 1, wherein the apparatus comprises one of a cell phone, a mobile computing device, or an internet of things (IOT) device incorporating the memory subsystem.

6. A method for a memory comprising:
determining a condition of a memory subsystem, the memory subsystem including a data input and a clock input;
determining a first delay of a first variable delay circuit coupled to the clock input and a second delay of a second variable delay circuit coupled to the data input based on the condition of the memory subsystem; and
dynamically controlling the first delay of the first variable delay circuit and the second delay of the second variable delay circuit based on the determined delay;
wherein the first variable delay circuit comprises:
a first multiplexer, wherein an output of the first multiplexer is coupled to the clock input of the memory subsystem; and
a first array of buffers, an output of each buffer of the first array of buffers coupled to a corresponding input of the first multiplexer, each buffer of the first array of buffers coupled together in a first daisy chain configuration, and a first buffer input of the first array of buffers coupled to a clock; and
wherein the second variable delay circuit comprises:
a second multiplexer, wherein an output of the second multiplexer is coupled to the data input of the memory subsystem; and
a second array of buffers, an output of each buffer of the second array of buffers coupled to a corresponding input of the second multiplexer, each buffer of the second array of buffers coupled together in a second daisy chain configuration, and a second buffer input of the second array of buffers coupled to a data path.

7. The method of claim 6, wherein the dynamically controlling the second delay of the second variable delay circuit comprises dynamically controlling a variable delay to the data input of the memory subsystem.

8. The method of claim 6, wherein the dynamically controlling the first delay of the first variable delay circuit comprises dynamically controlling a first variable delay to the clock input of the memory subsystem.

9. The method of claim 8, wherein the dynamically controlling the second delay of the second variable delay circuit further comprises dynamically controlling a second variable delay to the data input of the memory subsystem.

10. The method of claim 6, wherein the dynamically controlling comprises adjusting the first delay and the second delay based on at least one of timing data for a memory subsystem design of the memory subsystem, timing data for the memory subsystem, a voltage applied to the memory subsystem, or a temperature of the memory subsystem.

11. An apparatus for a memory comprising:
means for determining a condition of a memory subsystem, the memory subsystem including a data input and a clock input;
means for determining a first delay of a first variable delay circuit coupled to the clock input and a second delay of a second variable delay circuit coupled to the data input based on the condition of the memory subsystem; and
means for dynamically controlling the first delay of the first variable delay circuit based on the determined first delay and the second delay of the second variable delay circuit based on the determined second delay;
wherein the first variable delay circuit comprises:
a first multiplexer, wherein an output of the first multiplexer is coupled to the clock input of the memory subsystem; and
a first array of buffers, an output of each buffer of the first array of buffers coupled to a corresponding input of the first multiplexer, each buffer of the first array of buffers coupled together in a first daisy chain configuration, and a first buffer input of the first array of buffers coupled to a clock; and
wherein the second variable delay circuit comprises:
a second multiplexer, wherein an output of the second multiplexer is coupled to the data input of the memory subsystem; and
a second array of buffers, an output of each buffer of the second array of buffers coupled to a corresponding input of the second multiplexer, each buffer of the second array of buffers coupled together in a second daisy chain configuration, and a second buffer input of the second array of buffers coupled to a data path.

12. The apparatus of claim 11, wherein the means for dynamically controlling the second delay of the second variable delay circuit is configured to dynamically control a variable delay to the data input of the memory subsystem.

13. The apparatus of claim 11, wherein the means for dynamically controlling the first delay of the first variable delay circuit is configured to dynamically control a first variable delay to the clock input of the memory subsystem.

14. The apparatus of claim 13, wherein the means for dynamically controlling the second delay of the second variable delay circuit is further configured to dynamically control a second variable delay to the data input of the memory subsystem.

15. The apparatus of claim 11, wherein the means for dynamically controlling is configured to adjust the first delay and the second delay based on at least one of timing data for a memory subsystem design of the memory subsystem, timing data for the memory subsystem, a voltage applied to the memory subsystem, or a temperature of the memory subsystem.

16. The apparatus of claim 11, wherein the means for dynamically controlling the first delay of the first variable delay circuit is configured to output select bits to the first multiplexer to adjust the first delay of the first variable delay circuit.

17. The apparatus of claim 11, wherein the means for dynamically controlling the second delay of the second variable delay circuit is configured to output select bits to the second multiplexer to adjust the second delay of the second variable delay circuit.

18. The apparatus of claim 11, wherein the apparatus comprises one of a cell phone, a mobile computing device, or an internet of things (IOT) device incorporating the memory subsystem.

19. The apparatus of claim 1, wherein the controller is configured to dynamically control the first delay of the first variable delay circuit and the second delay of the second variable delay circuit by making adjustments to the first delay and the second delay to meet at least one of hold time or hold margin of the memory subsystem.

20. The method of claim 6, wherein the first delay of the first variable delay circuit and the second delay of the second variable delay circuit are dynamically controlled by making adjustments to the first delay and the second delay to meet at least one of hold time or hold margin of the memory subsystem.

21. The apparatus of claim 11, wherein the means for dynamically controlling is configured to dynamically control the first delay of the first variable delay circuit and the second delay of the second variable delay circuit by making adjustments to the first delay and the second delay to meet at least one of hold time or hold margin of the memory subsystem.

* * * * *